US008589462B2

(12) United States Patent
Spiegel et al.

(10) Patent No.: US 8,589,462 B2
(45) Date of Patent: Nov. 19, 2013

(54) DIGITAL OPTIMAL FILTER FOR PERIODICALLY ALTERNATING SIGNALS

(75) Inventors: Egbert Spiegel, Gelsenkirchen (DE); Andreas Kribus, Bochum (DE)

(73) Assignee: Elmos Semiconductor AG, Dortmund (DE)

( * ) Notice: Subject to any disclaimer, the term of this patent is extended or adjusted under 35 U.S.C. 154(b) by 711 days.

(21) Appl. No.: 12/812,699

(22) PCT Filed: Jan. 8, 2009

(86) PCT No.: PCT/EP2009/050168
§ 371 (c)(1),
(2), (4) Date: Oct. 5, 2010

(87) PCT Pub. No.: WO2009/090135
PCT Pub. Date: Jul. 23, 2009

(65) Prior Publication Data
US 2011/0022650 A1    Jan. 27, 2011

(30) Foreign Application Priority Data

Jan. 14, 2008  (EP) .................... 08100417
Aug. 13, 2008  (EP) .................... 08162320

(51) Int. Cl.
*G06F 17/10*    (2006.01)
(52) U.S. Cl.
USPC ........................... 708/319; 708/320
(58) Field of Classification Search
USPC ................................. 708/319–320
See application file for complete search history.

(56) References Cited

U.S. PATENT DOCUMENTS

| 4,751,663 | A | * | 6/1988 | Yamazaki | 708/300 |
| 5,381,356 | A | * | 1/1995 | Takahashi | 708/320 |
| 5,440,503 | A | * | 8/1995 | Maruyama | 708/313 |

FOREIGN PATENT DOCUMENTS

EP    0285328    10/1988

OTHER PUBLICATIONS

Sternad et al., "The Structure and Design of Realizable Decision Feedback Equalizers for IIR Channels with Colored Noise", XP-000133778, Jul. 1990, pp. 1-6.
Liang-Ming et al., "Matched Recursive Digital Filters", XP-000151430, Jul. 1990, pp. 1-3.
Kristoffersen, "Optimal Receiver Filtering in Pulsed Doppler Ultrasound Blood Velocity Measurements", XP-002530128, Jan. 1986, pp.
Smith, "The Scientist and Engineer's Guide to Digital Signal Processing", XP-002530126, Chapter 17, pp. 297-310.
Smith, "The Scientist and Engineer's Guide to Digital Signal Processing", XP-002530127, Chapter 17/3, pp. 1-5.

\* cited by examiner

*Primary Examiner* — Tan V. Mai
(74) *Attorney, Agent, or Firm* — Renner, Otto, Boisselle & Sklar, LLP

(57) ABSTRACT

A digital optimal filter having an especially sinusoidal pulse response uses a filter structure with a recursive and a transversal portion. The transversal portion comprises filter coefficients for the representation of scan results of half a period of the sinusoidal pulse response signal. The recursive filter structure is used to change the sign after generation of the scan results for half a period and to mark the start and the end of the pulse response. A plurality of periods can lie in between the start and the end of the pulse response, this is why the digital optimal filter can be used to extract especially sinusoidal burst signals from an original signal, namely in digital technology, which is advantageous for the implementation of IC's.

1 Claim, 14 Drawing Sheets

Shift register ( 8xP registers)

Figure 1:
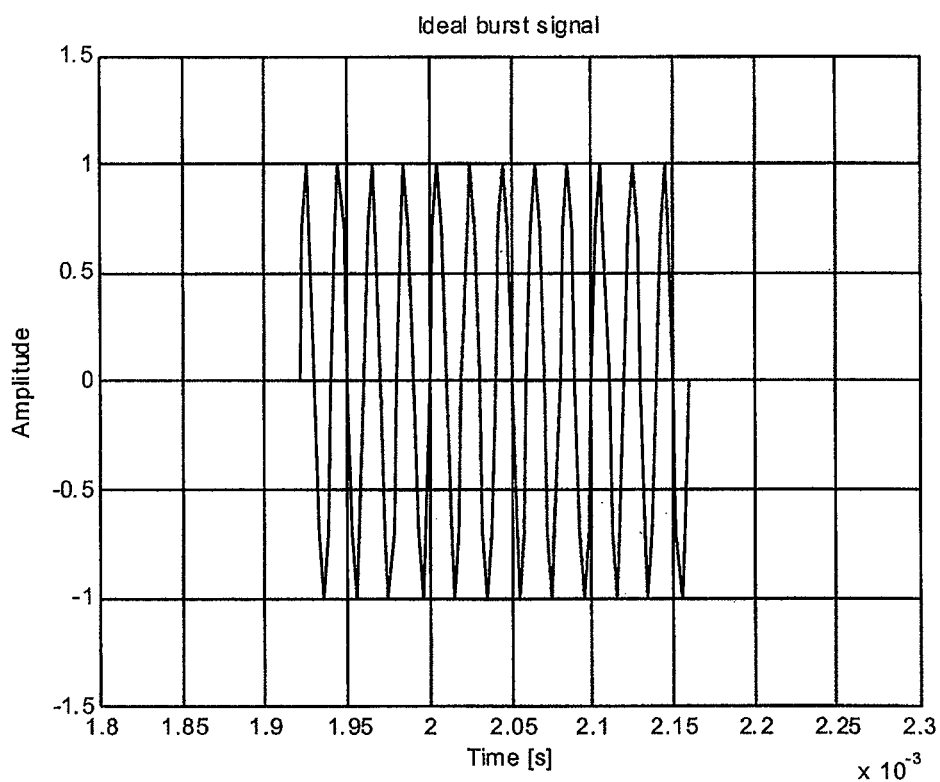

P-number of periods ns which are used e.g. for distance measurement
DIGITAL OPTIMAL FILTER FOR PERIODICALLY ALTERNATING SIGNALS The invention relates to a digital optimal filter for filtering out, from a (noisy) original signal, a periodic alternating signal (e.g. a burst signal) and particularly a sinusoidal signal with a presettable number of periods (so-called burst signals).

Thus, optimal filters are operative to generate, in response to a pulse at their input, a signal at their output whose signal curve is identical to the inverse temporal signal curve of a preset desired signal. This is to say that optimal filters can be used for extracting (filtering out), from an original signal, signals with desired signal curves such as so-called sinusoidal "burst" signals which are used e.g. for distance measurement in the automotive field (e.g. Park Distance Control, PCD). In this case, the objective is to extract the "burst" pulses from the noisy reflection signal of the "burst" transmission signal so that, then, the distance from a vehicle to an obstacle can be detected through long-term measurement or the like.

It is known that, in transversal (FIR) filters, the signal curve of the desired signal which is to be filtered out, can be filed in the form of coefficients by use of sample values describing the signal. In dependence on the complexity of the signal signal curve and the length of the signal, the description of the signal will require a large number of coefficients. For this reason and also because of the realization of multiplication functions in the FIR filter, the hardware expenditure for realizing such filters under the aspect of circuit technology is relatively high.

It is an object of the invention to provide a digital optimal filter of a simple design for extracting, from an original signal, a periodic alternating signal having a predetermined limited number of periods.

For achieving the above object, the invention proposes a digital optimal filter for filtering out, from an original signal, a periodic alternating signal, particularly a sinusoidal signal, having a presettable number of periods, said digital optimal filter comprising a transversal filter comprising a first shift register having an input and a number of cells which are equal to the number of sample values of the signal curve, over half a period, of the signal to be filtered out, and each of which has respectively an output, said outputs having assigned thereto coefficients selected corresponding to the sample values and respectively selected to be identical to the sample values, and comprising a first summator for summing the outputs of the cells of the first shift register that have been weighted by the respectively assigned coefficients, the output of the first summator forming the output of the transversal filter, and a recursive filter connected upstream of said transversal filter and having an input and an output, said output being connected to the input of the transversal filter, said recursive filter comprising
 a second summator connected to the input of the recursive filter and further connected to the output of a second shift register, the input of said second shift register being connected to the input of the recursive filter,
 a third summator connected to the output of the recursive filter, and
 a third shift register having an input connected to the output of the recursive filter and having an output connected to said third summator,
the number of cells of said third shift register between the input and the output thereof being equal to the number of sample values of the signal curve, over half a period, of the signal to be filtered out, the number of cells of said second shift register between the input and the output thereof being equal to the number of periods of the signal to be filtered out, multiplied by the number of sample values of the signal curve, over one period, of the signal to be filtered out, said third summator computing the difference between the outcome delivered by the second summator and the output of the third shift register and supplying said result to the output of the recursive filter, and the input of the recursive filter being adapted to receive a series of sample values of the ORIGINAL signal, and the total number of said sample values being equal to the number of sample values of the signal curve, per period, of the signal to be filtered out, multiplied by the number of periods.

The invention relates to the hardware implementation of an optimal filter for burst signals, particularly sinusoidal burst signals. Such a type of signals is used e.g. in ultrasonic-based distance measurement (inter alia, parking-assistant systems in cars). The implementation according to the invention comprises the following steps:

decomposition of the transfer function of the optimal filter into a recursive and a transversal portion.

realization of the recursive portion with a pole-zero pair at $z=e^{j2\pi f}$ (f=sine frequency) so that, with regard to the input/output behavior, there is continued to be obtained a filter with finite pulse response (FIR).

area-saving realization of the recursive portion with a RAM. Via the memory depth, the bandwidth of the filter can be set.

multiplication-free realization of the FIR portion with the aid of coefficients in CSD coding (CSD=Canonical Signed Digit).

INTRODUCTION

Figure 2:
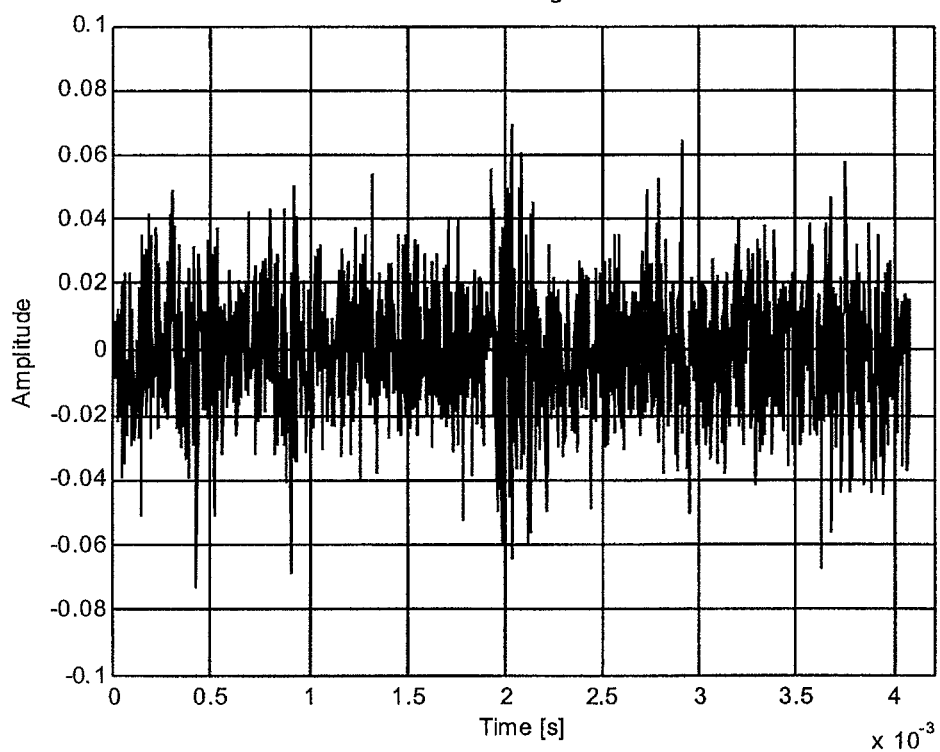
Figure 3:
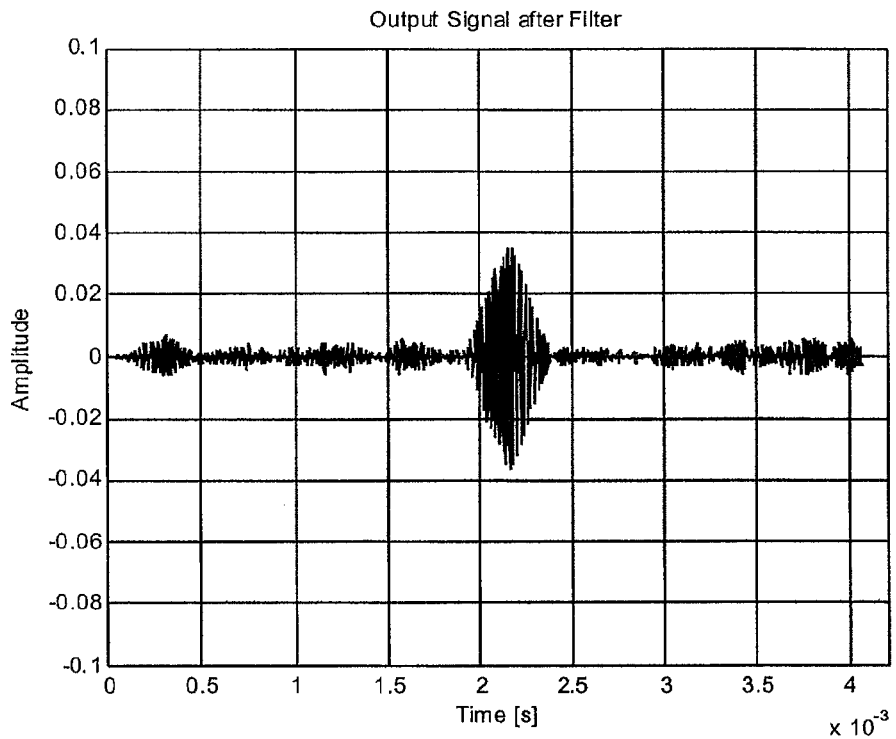
Figure 4:
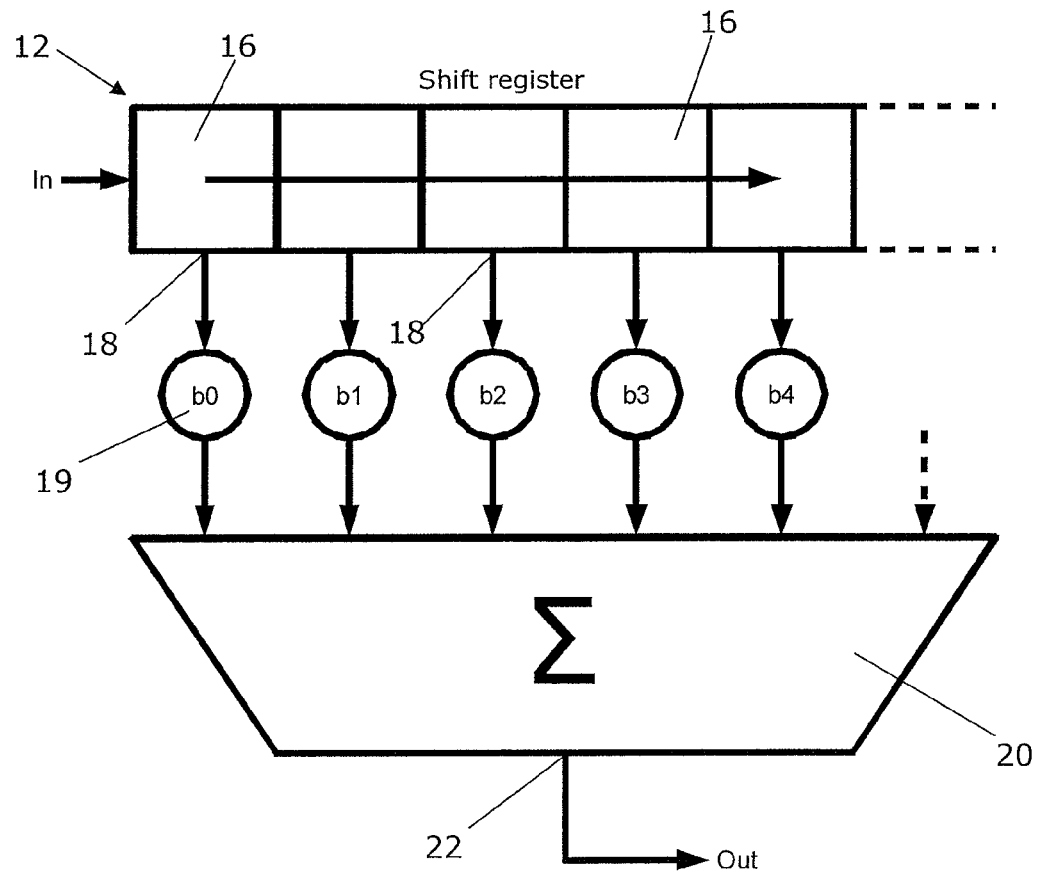
Figure 5:
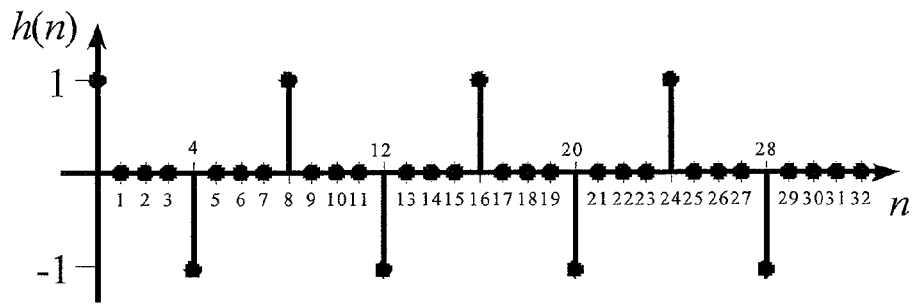
Figure 6:
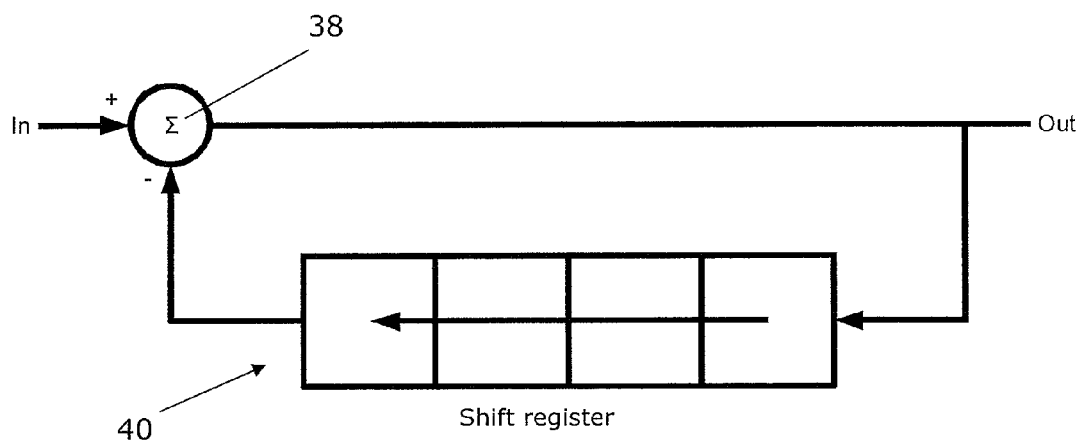
Figure 7:
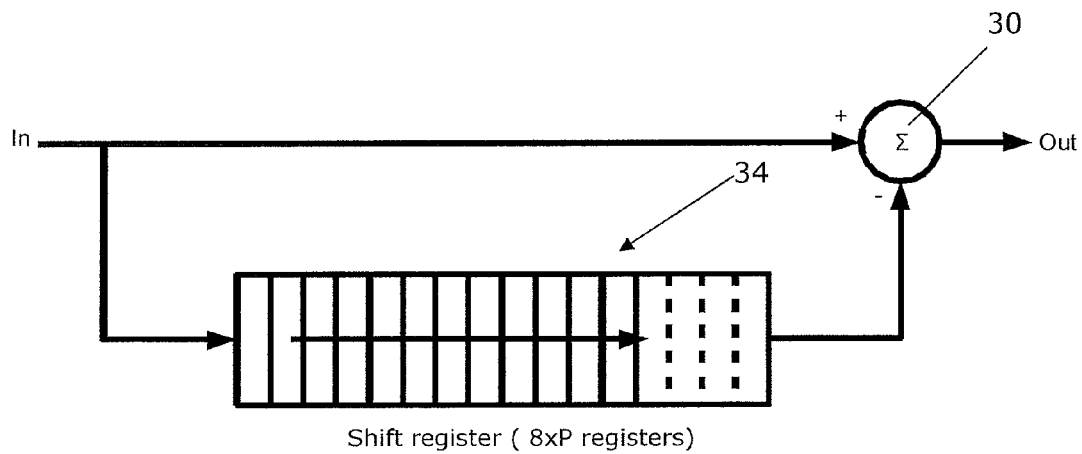
Figure 8:
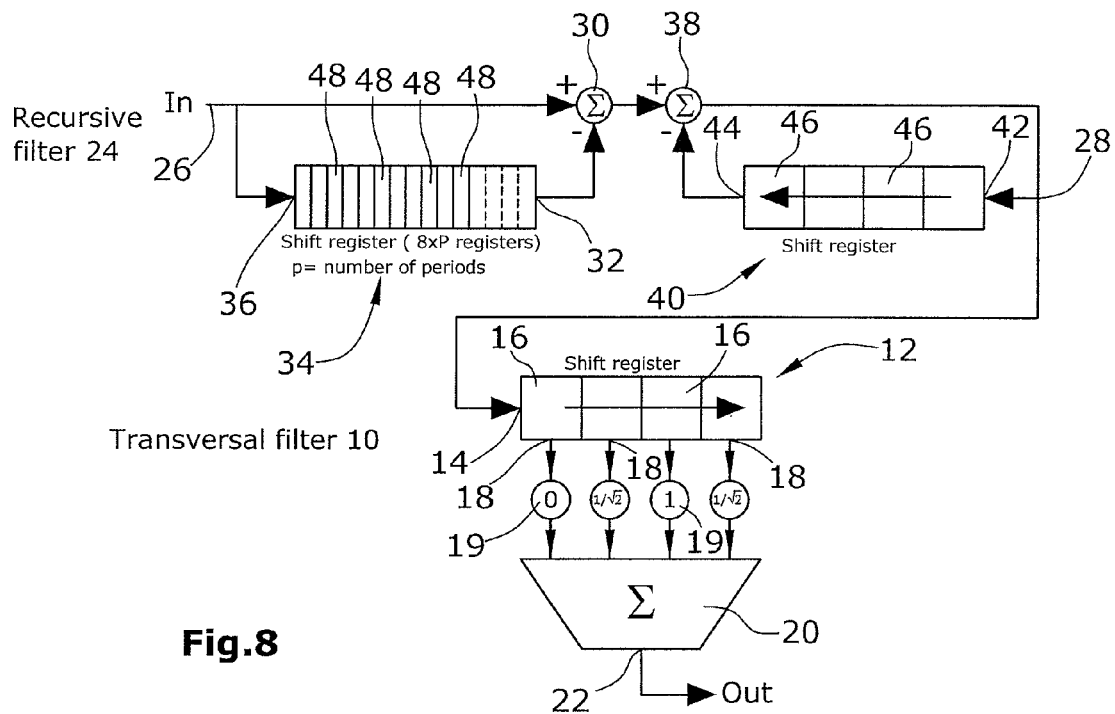
Figure 9:
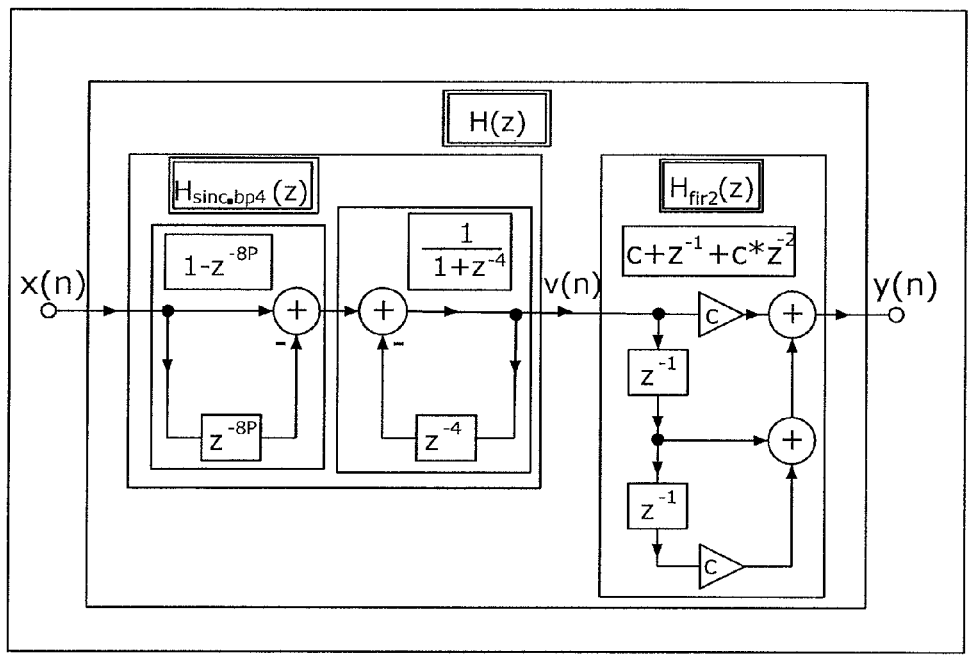
Figure 10:
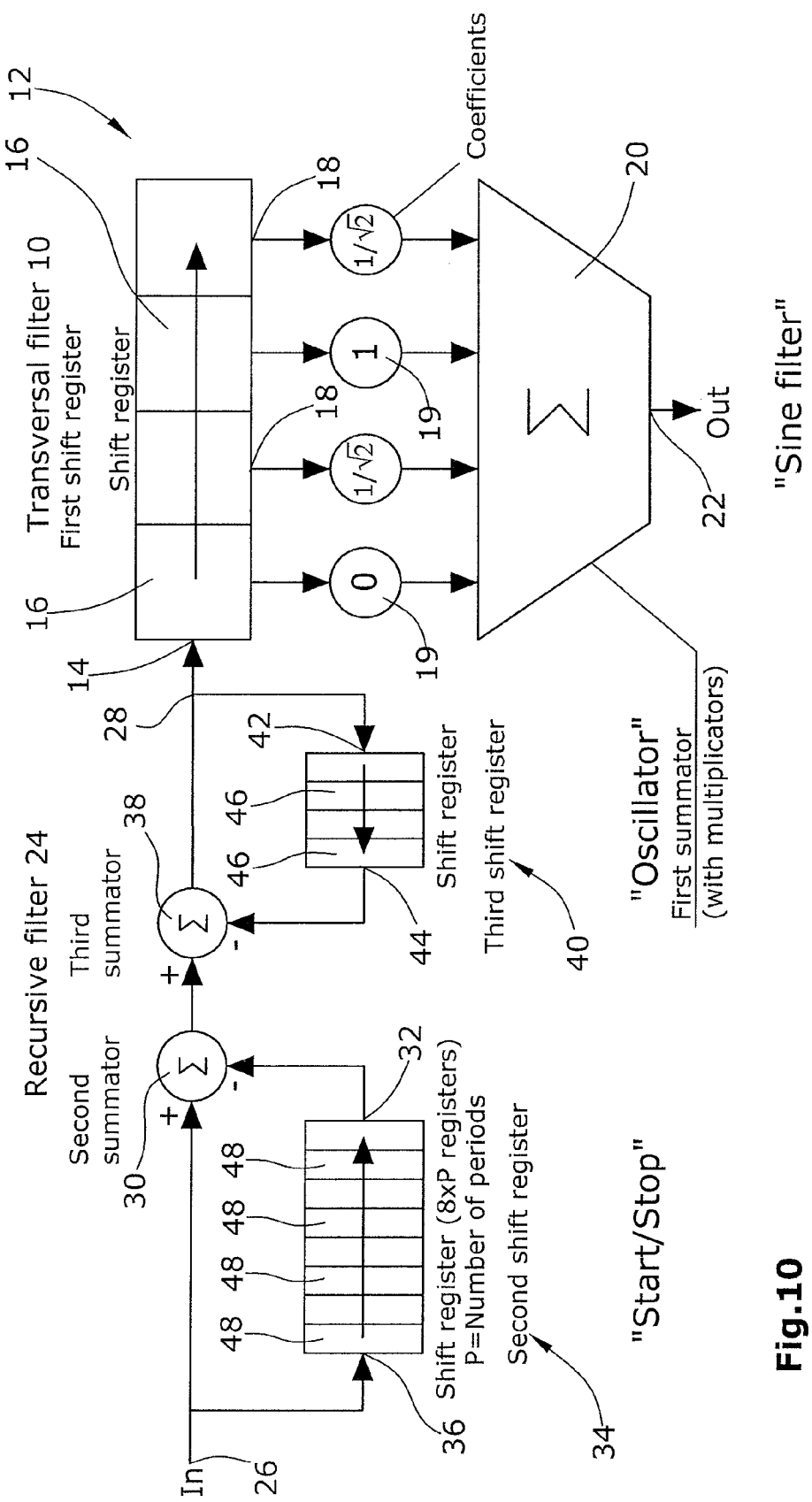
Figure 19:
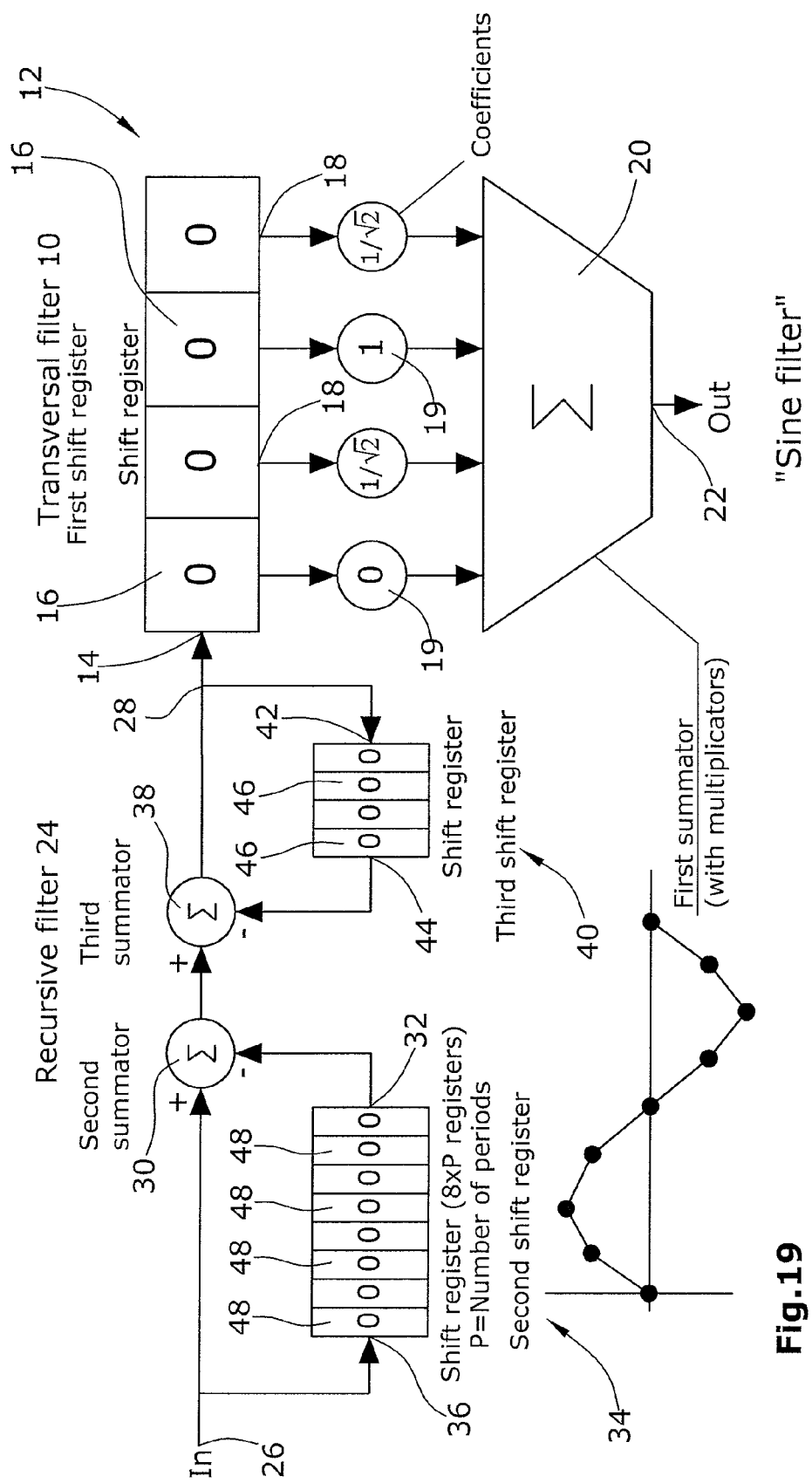

The invention will be explained in greater detail hereunder with reference to the drawing. The individual figures show the following:

FIG. 1 an idealized burst signal,
FIG. 2 a noisy burst signal,
FIG. 3 the signal at the output of the optimal filter,
FIG. 4 a transversal filter (FIR filter),
FIG. 5 the pulse sequence for driving a transversal filter with half a period,
FIG. 6 the circuit for generating the pulse sequence 1 0 0 0-1 0 0 0 1 0 . . . ,
FIG. 7 the circuit arranged upstream for canceling the pulse sequence,
FIG. 8 the complete filter structure for the case of 8 sample values/period,
FIG. 9 the filter structure in the Z-range (c=1/√2), and
FIG. 10 representations of the internal filter states upon application of a to FIG. 19 pulse at the input.

In ultrasonic-based distance measurement, use is made of sinusoidal burst signals which in the ideal case have the shape represented in FIG. 1.

After the signal has passed through the receiving amplifier, it has a noise signal superimposed on it. In case of objects situated in a large distance, the first-mentioned signal will have vanished in the noise (see FIG. 2).

By suitable filtration, the signal can be extracted from the noise. If the signal is known, it is possible, by suitable dimensioning, to maximize the signal-to-noise ratio at the output of the filter. Such a filter is called an optimal filter. From theory, it is known that the pulse response of an optimal filter is the time reverse of the to-be-detected signal. Since, in the present case, the signal is symmetrical, the pulse response is equal to the signal. If the signal is available digitally in time-discrete form, such a filter can be very easily designed as an FIR filter (FIR=Finite Impulse Response).

$$H(z)=b_0+b_1z^{-1}+b_2z^{-2}+\ldots+b_Nz^{-N}$$

In the present case of the sine burst, the coefficients can be computed as follows (N=number of sample values per period, P=number of periods).

for $i = 0:N\ L-1$ $$b_i = \sin\left(2\pi\frac{i}{N}\right).$$

FIG. 3 shows the response of the optimum filter of the above design to the noisy reception signal (in comparison thereto, see also FIG. 2).

Although the mathematical representation as an FIR filter is very simple, the practical realization in a signal processor or in hardware will very soon find its limits, which is due to the large number of multiplications or additions. The following paragraphs describe, by conversion into an equivalent representation, an implementation which is favorable under the surface-area aspect.

Design Target

It is aimed to design a filter whose impulse response corresponds to the temporally shifted transmitted signal. For purposes of simplification, there is assumed an ideal transmitted signal, i.e. a sinus burst with P periods. Scanning is performed e.g. with 8 samples per period (M=8) at a sample frequency $f_S$.

For realizing the optimal filter, one would have to add up N=M·P values, weighted by the corresponding coefficients. In case of a sine burst having a length of 12 periods, these would be 95 additions and 96 multiplications using the periodically repeating coefficients:

$$\left[\sin\left(\frac{\pi}{4}\right), \sin\left(\frac{\pi}{2}\right), \sin\left(\frac{3\pi}{4}\right), \sin(\pi), \sin\left(\frac{5\pi}{4}\right), \sin\left(\frac{3\pi}{2}\right), \sin\left(\frac{7\pi}{4}\right), \sin(2\pi)\right]$$

$$= \left[\frac{1}{\sqrt{(2)}}, 1, \frac{1}{\sqrt{(2)}}, 0, -\frac{1}{\sqrt{(2)}}, -1, -\frac{1}{\sqrt{(2)}}, 0\right]$$

In consideration of the zero- and one-coefficients and of the coefficient c which occurs several times, these would still be 72 additions and 12 multiplications.

In order to reduce this high number of operations, a recursive filter structure is derived which is equivalent to this filter.

At this point, it is to be noted that this filter corresponds to a Discrete Fourier Transformation (DFT) across the last N samples at the normed circular frequency $$\Omega = \frac{2\pi f}{f_s} = \frac{\pi}{4}.$$

Realization of a Suitable Optimal Filter with Sinusoidal Pulse Response

As mentioned initially, a filter with sinusoidal pulse response can be easily realized with the aid of a transversal filter structure (see FIG. 4).

The digital input word will be fed, on the left, into shift register 12 (according to claim 1, the first shift register) and will be shifted to the right by one position per system clock time. The outputs 18 of the cells 16 (register) of shift register 12 will be weighted by the coefficient ($b_i$) 19 and be summed up. For determining the pulse response, only one digital word other than zero will fed to the input. The rest of the digital words are zero. At each system clock time, said individual word will be successively weighted respectively by another coefficient and be fed to the output via the summator 20. If the coefficients 19 correspond to the value of the sinusoidal signal at the respective times, the pulse response will be sinusoidal. Generally, this structure is useful for generating any desired pulse responses. However, the expenditure for computation and hardware is considerable so that a direct implementation is economically unfavorable.

In a filter with sinusoidal pulse response, the coefficients will repeat themselves periodically. Also within a period, the coefficients will repeat themselves, but with inverted sign. If, now, there is designed a transversal filter with the coefficients for only half a sinusoidal curve (half a period) and if said filter is then supplied with a corresponding series of "1"-, "0"- and "−1"-values, there will again be obtained a sinusoidal output signal. In case of 8 sample values/period, the pulse sequence according to FIG. 5 will be generated.

A "1" followed by three "0"s will generate a positive sinusoidal half-wave, and a "−1" followed by three "0"s will generate a negative sinusoidal half-wave. A circuit for generating such a pulse sequence can be formed with the aid of a fed-back shift register 40 (according to claim 1, the third shift register) and a summator 38 (according to claim 1, the third summator) depicted in FIG. 6.

If a single "1" is applied to the input (In), said "1" will appear directly at the output (Out). After a delay of 4 system clock times, said "1" will be fed, with inverted sign, into the summator 38 and will appear as a "−1" at the output. After further 4 clock cycle times, a "−1" will be obtained again. Since this process will be continued for a random number of times, it has to be deleted again, corresponding to the number of periods, after a certain length of time. This purpose is served by the circuit according to FIG. 7 wherein use is made of a further shift register 34 (according to claim 1, the second shift register) and a summator 30 (according to claim 1, the second summator).

Thus, if a single "1" is applied to the input (In), said "1" will appear directly at the output (Out). After 8*P system cycle times (corresponding to P periods and 8 sample values/period), said "1" will appear at the output 32 of the shift register 34 and thus as a "−1" at the output (Out) of the circuit according to FIG. 7. Said "−1" will then meet a "1" at the output of the shift register of the following circuit, the resulting sum being zero. Thus, the entire filter circuit has the structure depicted in FIG. 8.

With the aid of a Z-transformation, the filter structure can be converted into the corresponding transfer functions (see FIG. 9).

As a transfer function, there is obtained:

$$H(z) = \frac{1-z^{-8P}}{1+z^{-4}}\left(\frac{1}{\sqrt{2}} + z^{-1} + \frac{1}{\sqrt{2}} \cdot z^{-2}\right)$$

The use of 8 sample values has merely exemplary character. Generally, all even-numbered values are suitable.

The transfer function can also be mathematically derived by equivalence transformations.

EXAMPLE

From FIGS. 10 to 19, it becomes evident how it is possible, by applying a pulse (represented by a normalized signal with the sample value "1" at the time of the occurrence of the pulses and the sample values "0" at the other scan times) at the input of the recursive filter, i.e. at the input of the optimal filter, that a desired sinusoidal pulse response will be generated at the output of the filter, i.e. at the output of the transversal filter. Herein, it is assumed that a sinusoidal half-wave (a half-period) is represented by four sample values and that it is desired to generate a sinusoidal burst signal with a number P of periods. At this point, it be noted that designing the filter via the pulse response is representative only of one of a plurality design methods. There exist a plurality of realizations, all of them comprising the same pulse response and thus having an identical behavior. In case of a real signal, the internal filter states could also be imagined visually. Ultimately, however, each signal can be assembled from a sequence of overlapping pulses of different levels. In principle, each sample value is such a pulse (a scan is a multiplication by a so-called Dirac comb). Therefore, observation of a single pulse response will be sufficient.

Figure 11:
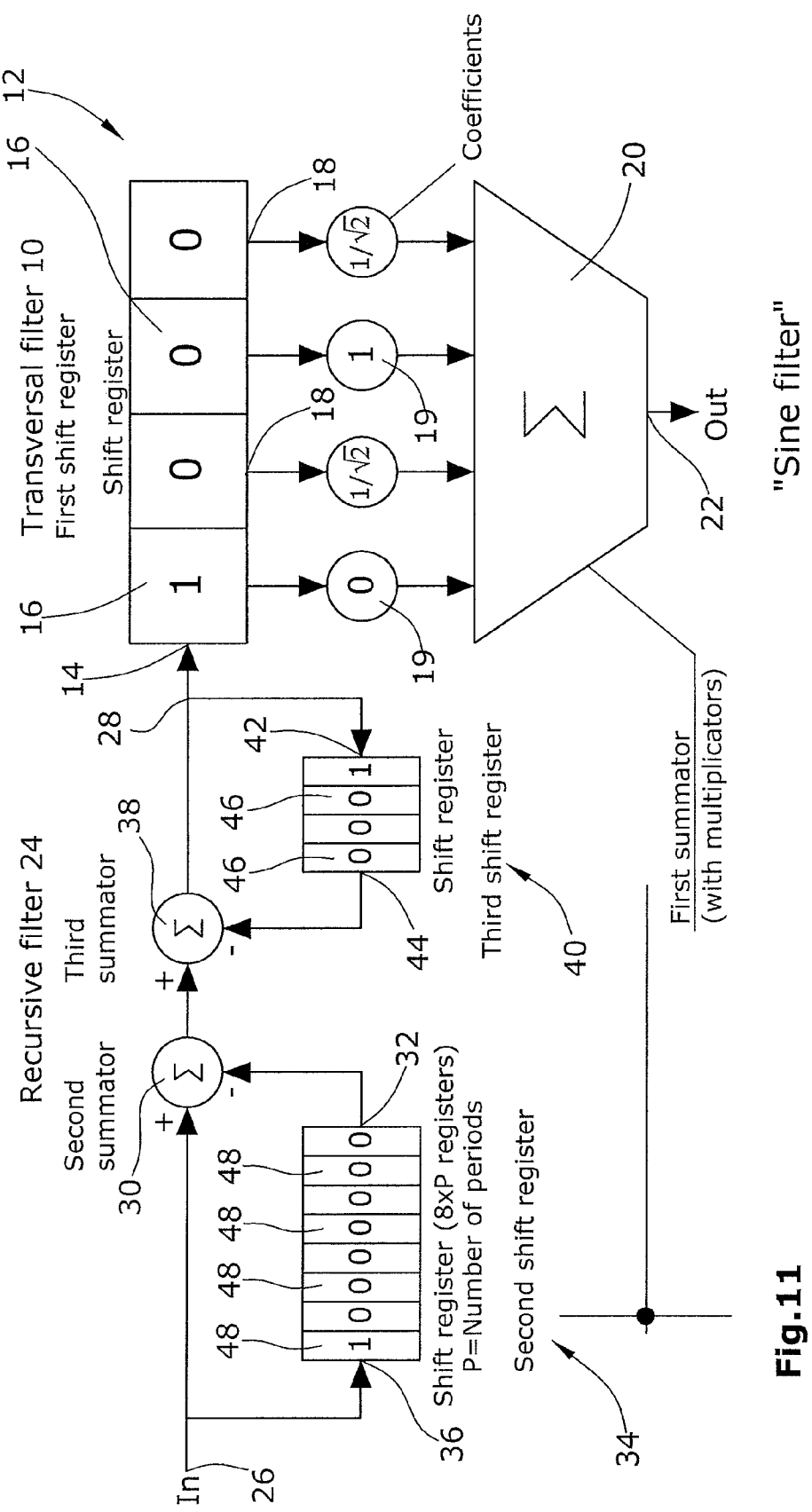
Figure 12:
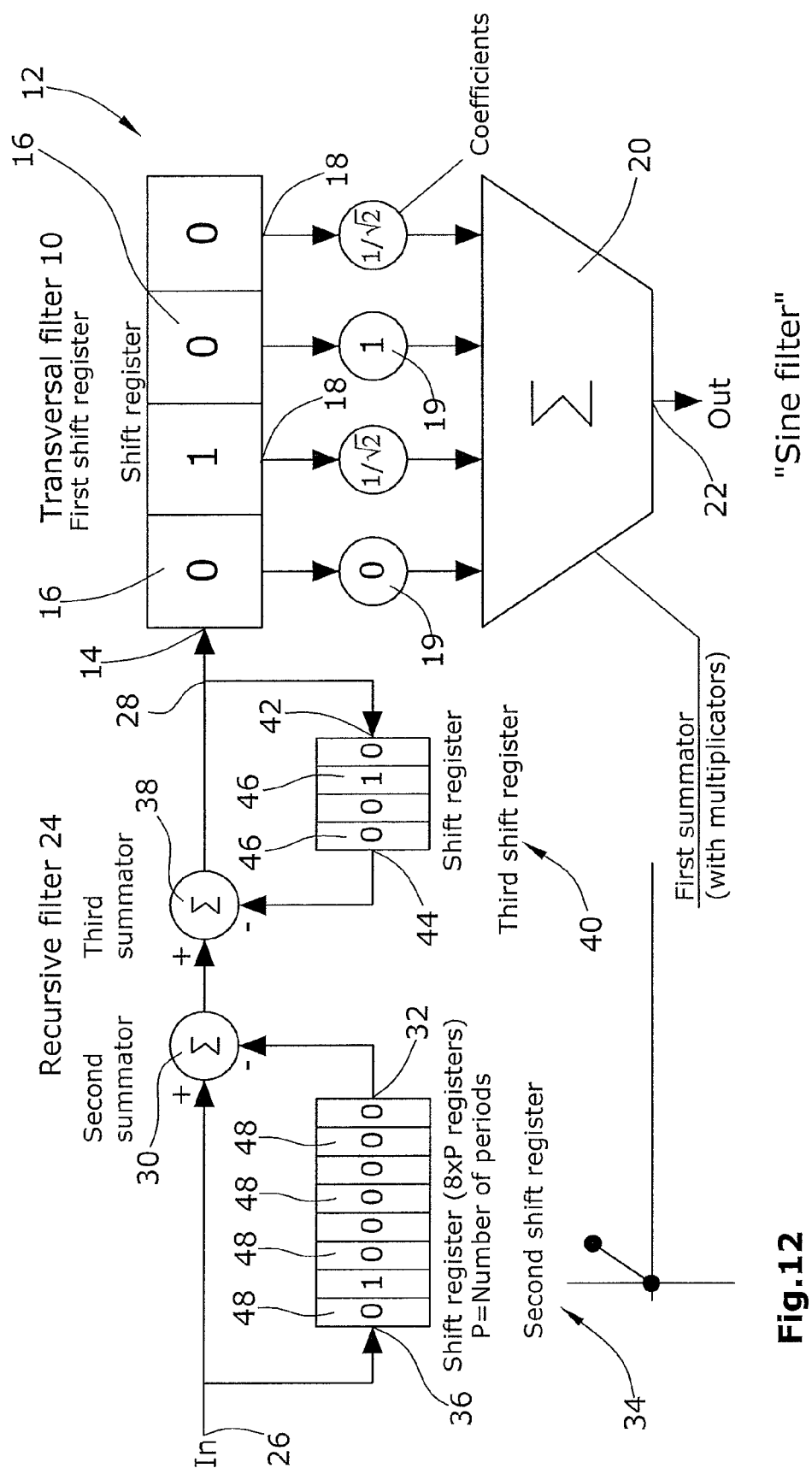
Figure 13:
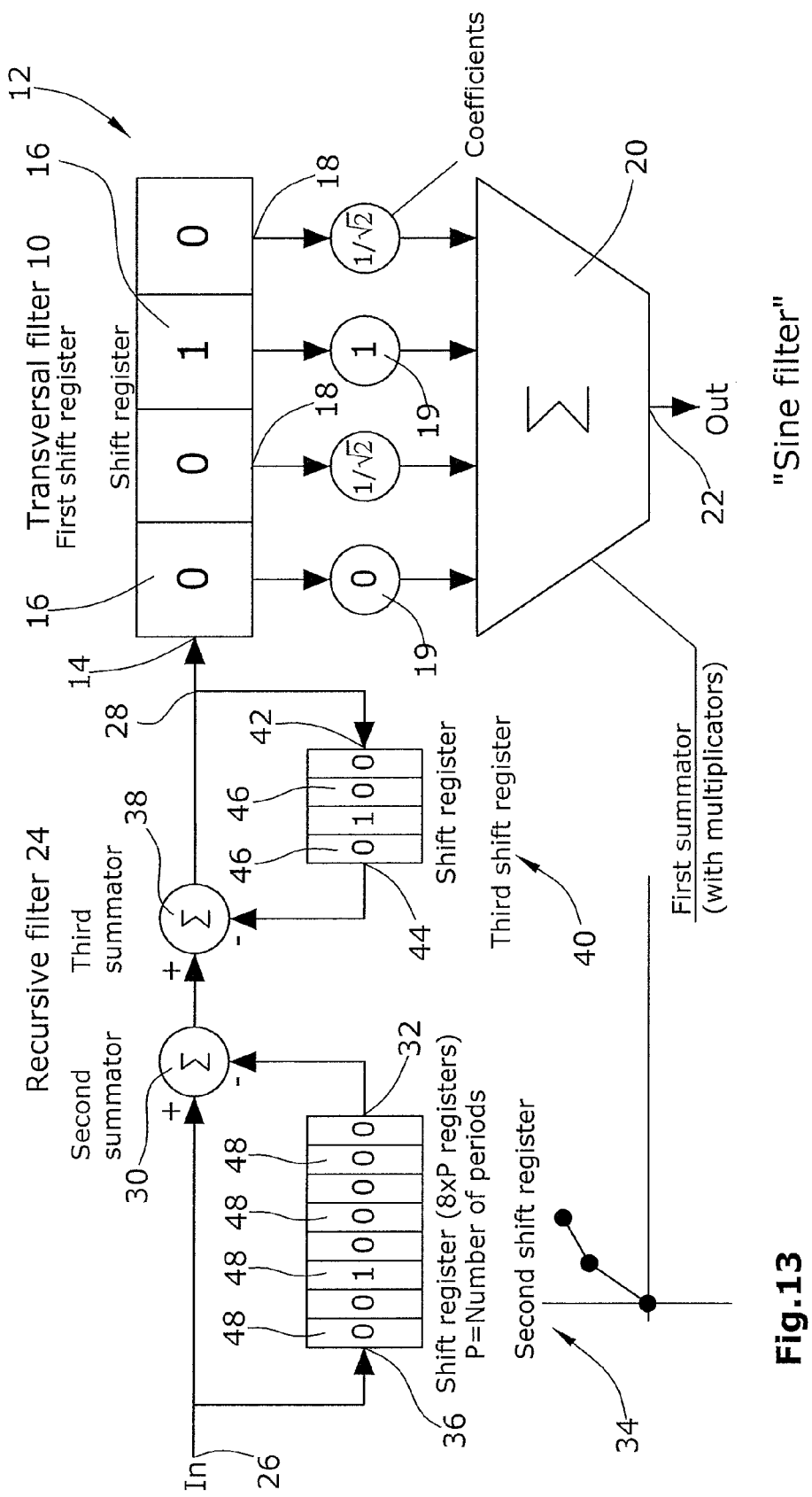
Figure 14:
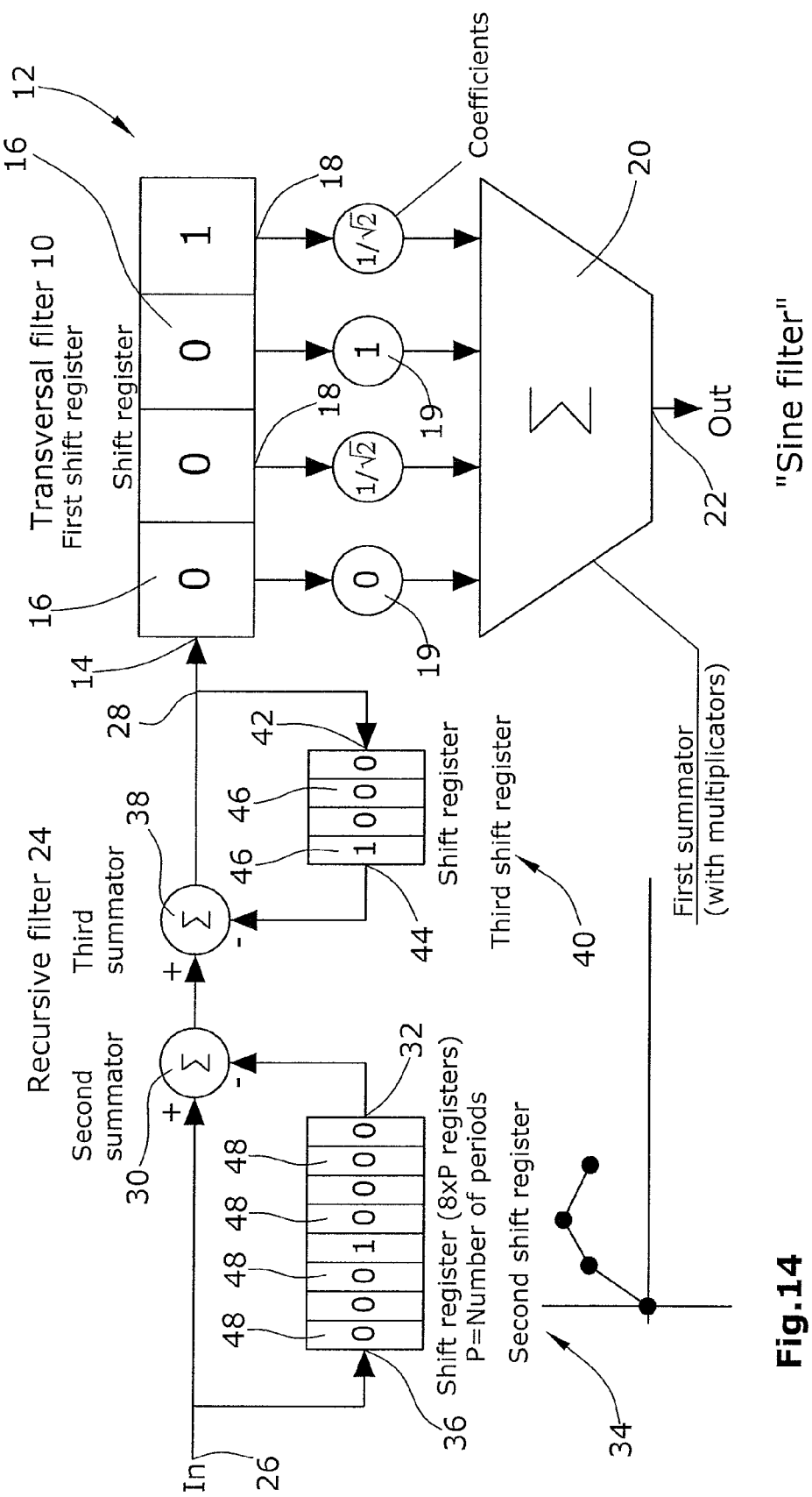
Figure 15:
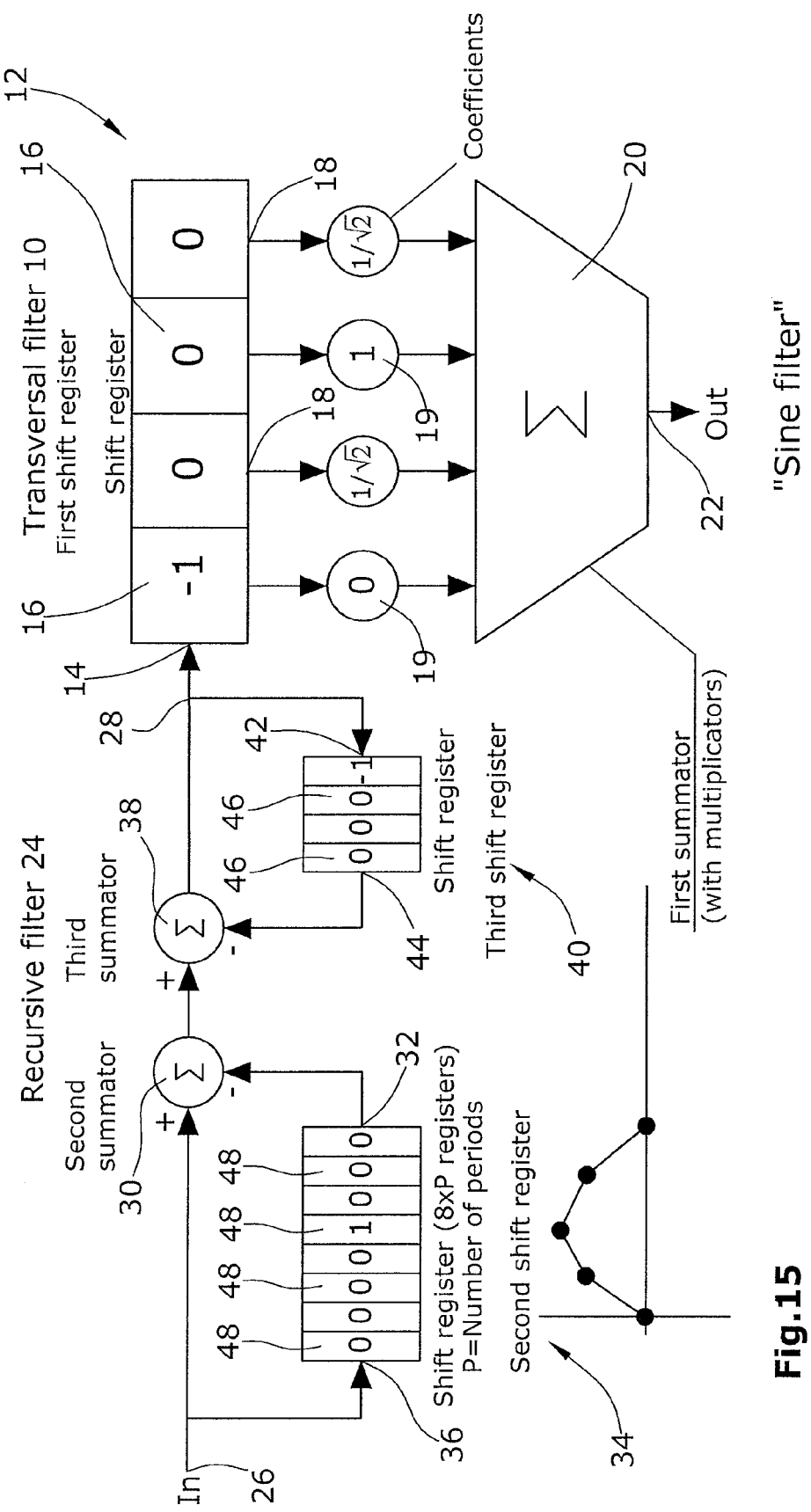
Figure 16:
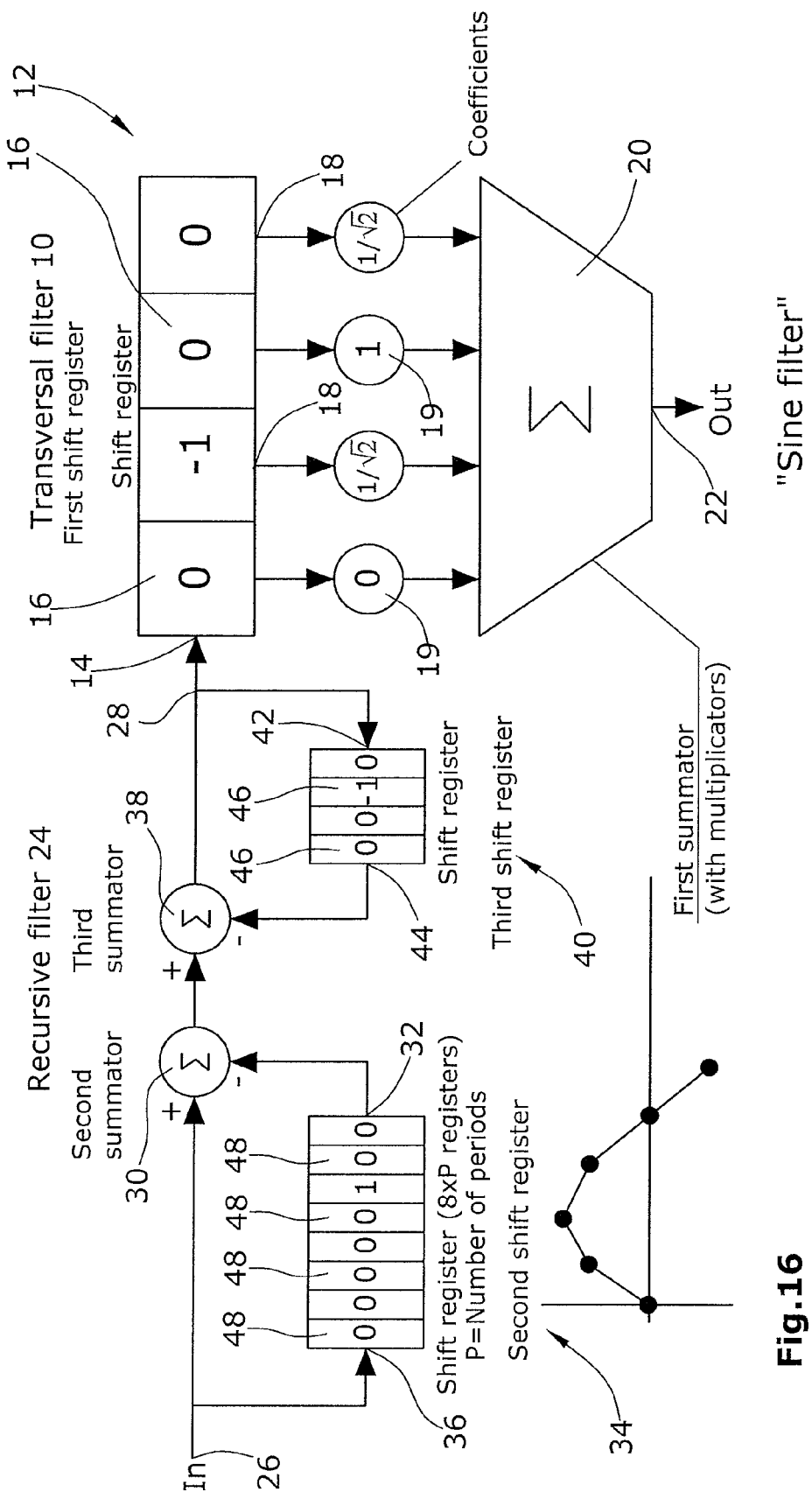
Figure 17:
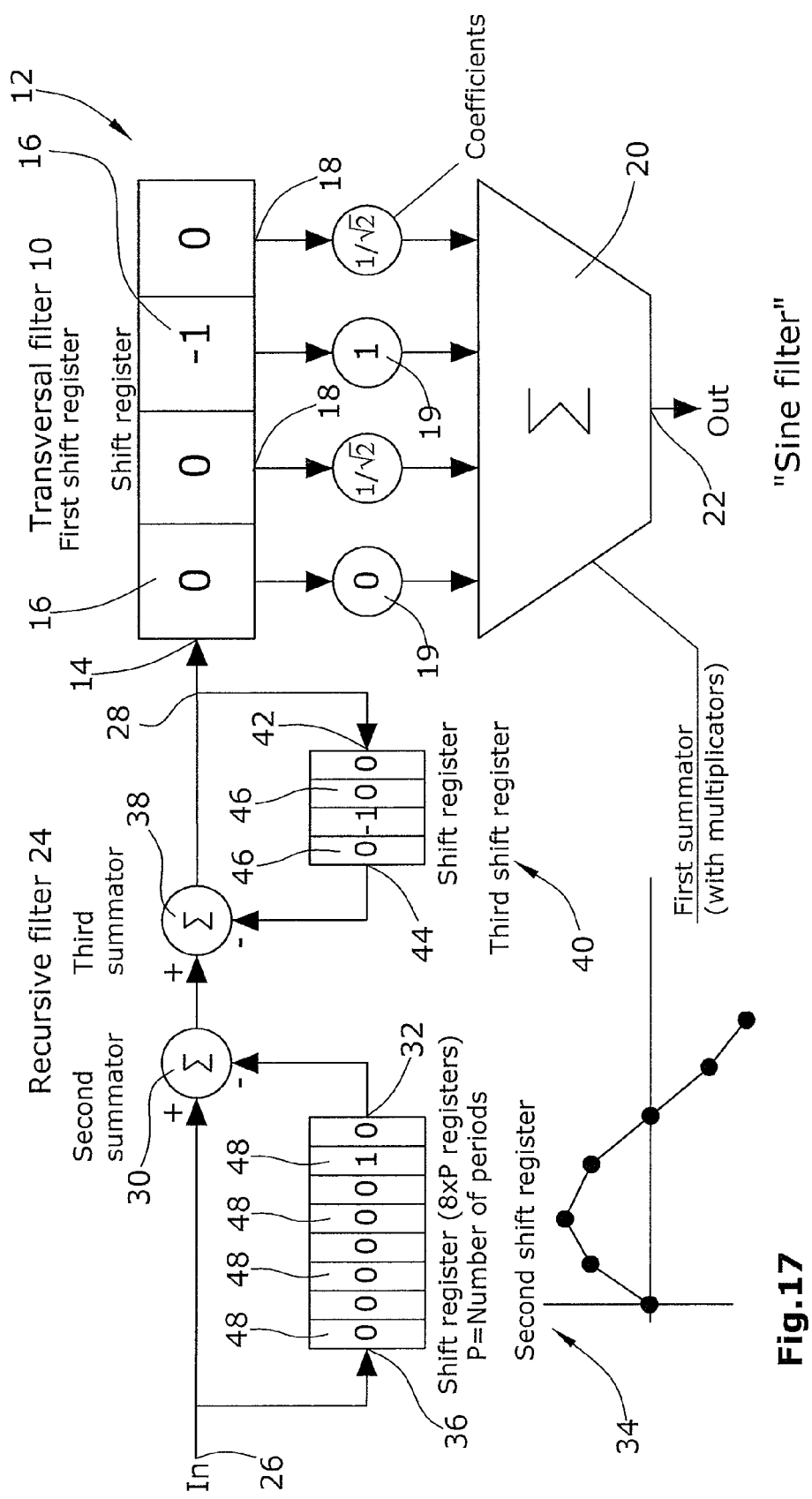
Figure 18:
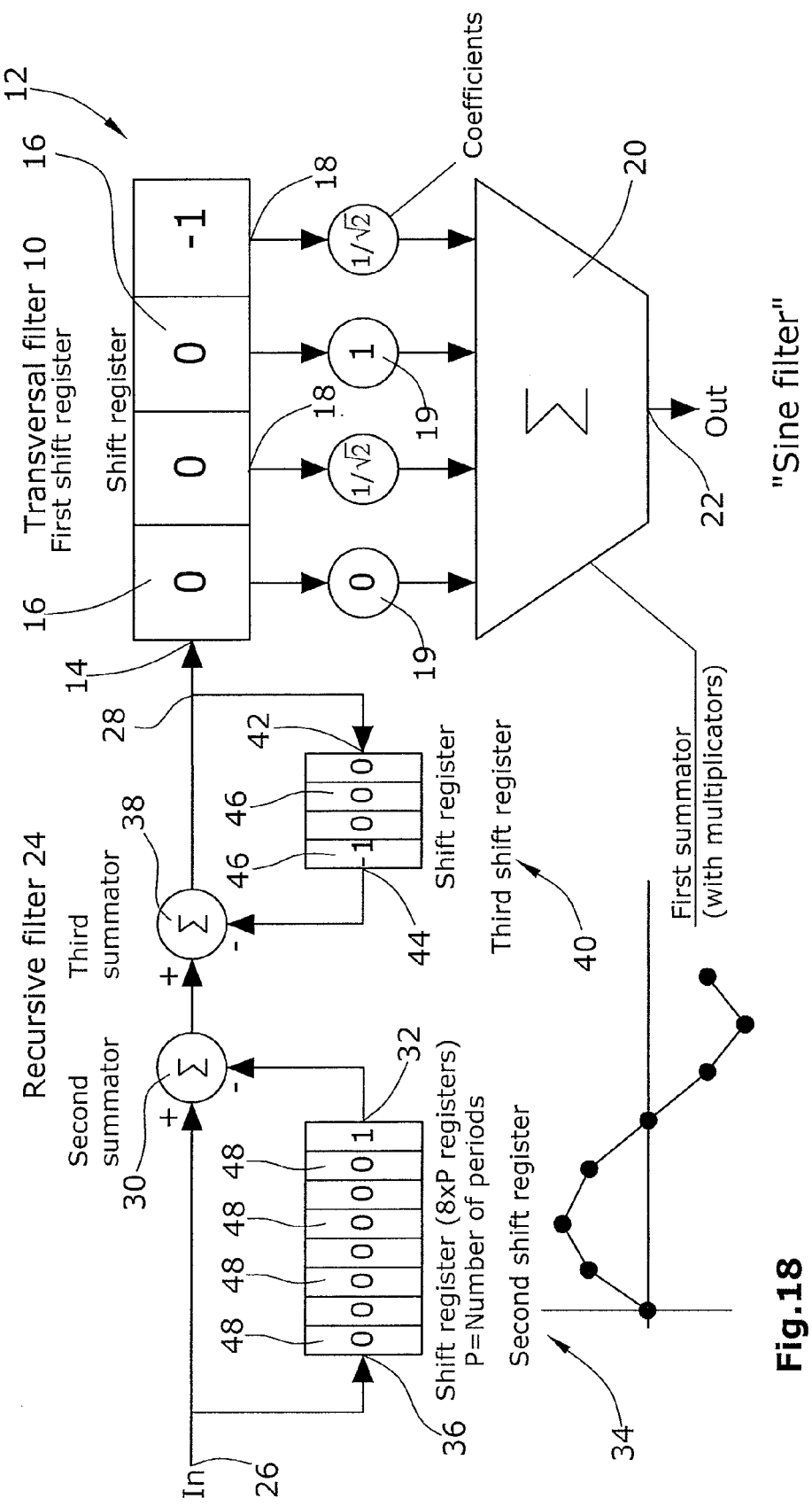

FIG. 10 again shows the overall configuration of the digital optimal filter with a recursive filter and a transversal filter arranged downstream thereof. In FIG. 11, there is now illustrated the situation where, at a specific (system) clock time, the pulse value normalized to "1.0" is applied to the input In of the digital optimal filter. Then, this value will automatically be also in the first (register) cell of the second shift register of the recursive filter. In the last cell of the second shift register, a "0" is stored, so that the result of the difference formation by the second summator is "1". Said "1" will then also be present at the output of the recursive filter because the third shift register has stored a "0" in its last cell connected to the third summator. Said "1" will be entered into the first shift register of the transversal filter and, then, will be present in the first cell of this first shift register, whose output signal will be multiplied by the coefficient 0. The other cells of the first shift register are occupied by "0". In the first summator, there is thus generated a "0" so that a "0" is present at the output Out of the digital optimal filter, which is also indicated in the drawing where FIGS. 11 to 19 show, step by step, the origination of the signal curve of the sinusoidal signal.

At the next clock time (see FIG. 12), a "0" is present at the input In of the digital optimal filter. The two "1"s in the first two cells of the second and third shift registers will be pushed through. At the output of the recursive filter, a "0" is generated. Thus, the "1" in the first shift register of the transversal filter will be pushed through the filter into the second cell thereof, the output signal of said cell being multiplied by the coefficient $1/\sqrt{2}$. At the output Out, the sample value will then be present after ⅛ of a period.

This process will be continued as shown in FIGS. 13 to 19 so as to generate the pulse response at the output of the digital optimal filter. It is still to be noted that, starting with the situation according to FIG. 15, "sign change" occurs in the third shift register of the recursive filter. The generation of said sign change takes place, according to FIG. 14, when, further on, as usual in a pulsed input signal, a "0" is present at the input of the digital optimal filter; this is because, in the third summator, the last cell of the third shift register, which cell is connected to the third summator, will be subtracted from the "0" supplied by the second summator and thus will result in "−1".

Thus, by use of the above described digital optimal filter whose behavior has been described above in regard to its pulse response with reference to FIGS. 10 to 19, it is rendered possible to extract, from a noisy original signal, a periodic alternating signal having a predetermined number periods, which in the present embodiment is a burst signal.

The invention claimed is:

1. A digital optimal filter for filtering out, from an original signal, a periodic alternating signal, particularly a sinusoidal signal, having a presettable number of periods, said digital optimal filter comprising
    a transversal filter (10) comprising a first shift register (12) having an input (14) and a number of cells (16) which are equal to the number of sample values of the signal curve, over half a period, of the signal to be filtered out, and each of which has respectively an output (18), said outputs (18) having assigned thereto coefficients (19) selected corresponding to the sample values and respectively selected to be identical to the sample values, and comprising a first summator (20) for summing the outputs (18) of the cells (16) of the first shift register (12) that have been weighted by the respectively assigned coefficients, the output (22) of the first summator (12) forming the output of the transversal filter (10), and
    a recursive filter (24) connected upstream of said transversal filter (10) and having an input (26) and an output (28), said output being connected to the input (14) of the transversal filter (10),
    said recursive filter (24) comprising
        a second summator (30) connected to the input (26) of the recursive filter and further connected to the output (32) of a second shift register (34), the input (36) of said second shift register being connected to the input (26) of the recursive filter (24),
        a third summator (38) connected to the output (28) of the recursive filter (24), and
        a third shift register (40) having an input (42) connected to the output (28) of the recursive filter (24) and having an output (44) connected to said third summator (38),
    the number of cells (46) of said third shift register (40) between the input and the output (42,44) thereof being equal to the number of sample values of the signal curve, over half a period, of the signal to be filtered out,
    the number of cells (48) of said second shift register (34) between the input and the output (36,32) thereof being equal to the number of periods of the signal to be filtered out, multiplied by the number of sample values of the signal curve, over one period, of the signal to be filtered out,
    said third summator (38) computing the difference between the outcome delivered by the second summator (30) and the output of the third shift register (44) and supplying said result to the output (28) of the recursive filter (24), and
    the input (26) of the recursive filter (24) being adapted to receive a series of sample values of the original signal, and the total number of said sample values being equal to the number of sample values of the signal curve, per period, of the signal to be filtered out, multiplied by the number of periods.

* * * * *